(12) United States Patent
Jeong et al.

(10) Patent No.: US 11,152,926 B2
(45) Date of Patent: Oct. 19, 2021

(54) MODULATOR FOR CONTROLLING CURRENT PULSE AND METHOD THEREOF

(71) Applicant: KOREA ATOMIC ENERGY RESEARCH INSTITUTE, Daejeon (KR)

(72) Inventors: Young Uk Jeong, Daejeon (KR); Gudkov Boris, Daejeon (KR); Ki Tae Lee, Sejong-si (KR); Sangyoon Bae, Daejeon (KR); Tae Sik Yoon, Daejeon (KR)

(73) Assignee: KOREA ATOMIC ENERGY RESEARCH INSTITUTE, Daejeon (KR)

( * ) Notice: Subject to any disclaimer, the term of this patent is extended or adjusted under 35 U.S.C. 154(b) by 190 days.

(21) Appl. No.: 16/543,907

(22) Filed: Aug. 19, 2019

(65) Prior Publication Data
US 2020/0067494 A1 Feb. 27, 2020

(30) Foreign Application Priority Data

Aug. 24, 2018 (KR) .................. 10-2018-0099271

(51) Int. Cl.
*H03K 17/60* (2006.01)
*H03K 3/57* (2006.01)
(52) U.S. Cl.
CPC ............. *H03K 3/57* (2013.01); *H03K 17/601* (2013.01)
(58) Field of Classification Search
USPC ....................................................... 307/106
See application file for complete search history.

(56) References Cited

U.S. PATENT DOCUMENTS

| 5,444,610 A | 8/1995 | Gaudreau et al. |
| 5,646,833 A | 7/1997 | Gaudreau et al. |

(Continued)

FOREIGN PATENT DOCUMENTS

| CN | 203039612 | 7/2013 |
| CN | 106230304 | 12/2016 |

(Continued)

OTHER PUBLICATIONS

SIPO, Office Action of CN 201910792116.6 dated Jan. 15, 2021.
SIPO, Search Report of CN 201910792116.6 dated Jul. 2, 2021.

*Primary Examiner* — Toan T Vu
*Assistant Examiner* — Xuan Ly
(74) *Attorney, Agent, or Firm* — Lex IP Meister, PLLC

(57) ABSTRACT

A modulator includes: a high voltage transformer transforming a voltage supplied through a primary side and a secondary side to apply a current pulse to a driving device; a bipolar pulse generator applying a magnetizing pulse and a main pulse to a connection line connected to the primary side of the high voltage transformer; and a timing controller controlling a time difference of applying the magnetizing pulse and the main pulse, wherein the bipolar pulse generator includes a magnetizing pulse generation unit generating the magnetizing pulse by using positive power, and a main pulse generation unit generating a negative pulse by using negative power. Also, the modulator includes a pulse waveform controller in which a plurality of unit modules of the same structure is disposed in series through a small transformer on the secondary side of the high voltage transformer. These two configurations may independently control the magnitude and the waveform of the current pulse of the high voltage, respectively and realize simultaneously two functions.

26 Claims, 15 Drawing Sheets

(56) References Cited

U.S. PATENT DOCUMENTS

| | | |
|---|---|---|
| 5,905,646 A | 5/1999 | Crewson et al. |
| 5,933,335 A | 8/1999 | Hitchcock et al. |
| 6,246,598 B1 | 6/2001 | Tarter et al. |
| 6,340,912 B1 | 1/2002 | Gerstenberg et al. |
| 7,660,137 B1 | 2/2010 | Goins et al. |
| 2003/0128554 A1 | 7/2003 | Crewson et al. |
| 2008/0224794 A1* | 9/2008 | London ............... H04L 25/0278 333/20 |
| 2011/0235368 A1* | 9/2011 | Khan ................... H02M 7/217 363/16 |
| 2014/0254226 A1* | 9/2014 | Nakazawa ........... H02M 7/483 363/131 |
| 2014/0270034 A1 | 9/2014 | Clayton et al. |
| 2014/0320105 A1 | 10/2014 | Liu et al. |
| 2015/0365006 A1* | 12/2015 | Choi ................ H02M 3/33592 363/21.02 |
| 2016/0028304 A1 | 1/2016 | O'Day |

FOREIGN PATENT DOCUMENTS

| | | |
|---|---|---|
| EP | 0827280 | 3/1998 |
| EP | 1554801 | 8/2011 |
| EP | 0947048 | 5/2012 |
| EP | 2099127 | 8/2014 |
| EP | 2800273 | 11/2014 |
| EP | 2294692 | 12/2016 |
| JP | S48-007371 | 3/1973 |
| JP | S50-114538 | 9/1975 |
| JP | S62-208528 | 9/1987 |
| JP | 2000-134943 | 5/2000 |
| JP | 2002-354846 | 12/2002 |
| JP | 2002354846 | * 12/2002 |
| JP | 2003-109794 | 4/2003 |
| JP | 2004-103423 | 4/2004 |
| JP | 2004103423 | * 4/2004 |
| JP | 2005-521202 | 7/2005 |
| JP | WO2005094138 | * 10/2005 |
| JP | 4195390 | 12/2008 |
| JP | 4654242 | 3/2011 |
| JP | 2012-084510 | 4/2012 |
| JP | 5414790 | 2/2014 |
| JP | 2015-148015 | 8/2015 |
| JP | 2017-174586 | 9/2017 |
| KR | 10-0276019 | 12/2000 |
| KR | 10-0784071 | 12/2007 |
| KR | 10-2009-0017456 | 2/2009 |
| KR | 10-2010-0091223 | 8/2010 |
| KR | 10-1773878 | 9/2017 |
| WO | 98/28845 | 7/1998 |
| WO | 01/52415 | 7/2001 |
| WO | 03/061125 | 7/2003 |
| WO | 2005-094138 | 10/2005 |
| WO | 2006-004512 | 1/2006 |
| WO | 2012-001409 | 1/2012 |
| WO | 2016-156852 | 10/2016 |
| WO | 2016-156854 | 10/2016 |

* cited by examiner (a)

MODULATOR FOR CONTROLLING CURRENT PULSE AND METHOD THEREOF

CROSS-REFERENCE TO RELATED APPLICATION

This application claims priority to and the benefit of Korean Patent Application No. 10-2018-0099271 filed in the Korean Intellectual Property Office on Aug. 24, 2018, the entire contents of which are incorporated herein by reference.

BACKGROUND OF THE INVENTION

(a) Field of the Invention

A modulator for controlling a current pulse and a method thereof are provided.

(b) Description of the Related Art

Generally, a modulator is used as power supply for driving a high-power pulsed radio-frequency source, such as a magnetron or a klystron.

Recently, as a modulator using an insulated gate bipolar transistor (IGBT) high voltage solid-state switch has been developed, compared to a conventional line-type modulator, a limitation of a pulse length has been relaxed and a control of the pulse waveform has been improved.

However, unlike klystron, which has high linearity, the magnetron has high non-linearity. Due to this characteristic, when the magnetron is in operation, a large current value changes even with a small voltage change.

Therefore, control techniques are being researched to obtain an appropriate pulse current magnitude or waveform of the high non-linearity magnetron.

Korean Patent No. 1,773,878 discloses "Magnetron controller for electron accelerator.

The above information disclosed in this Background section is only for enhancement of understanding of the background of the invention and therefore it may contain information that does not form the prior art that is already known in this country to a person of ordinary skill in the art.

SUMMARY OF THE INVENTION

An exemplary embodiment of the present invention is for independently and simultaneously implementing a function of controlling the magnitude of the current pulse in real time and a function of controlling the waveform of the current pulse in the modulator driving the magnetron.

A modulator according to an exemplary embodiment of the present invention includes: a high voltage transformer transforming a voltage supplied through a primary side and a secondary side to apply a current pulse to a driving device; a bipolar pulse generator applying a magnetizing pulse and a main pulse to a connection line connected to the primary side of the high voltage transformer; and a timing controller controlling a time difference of applying the magnetizing pulse and the main pulse, wherein the bipolar pulse generator includes a magnetizing pulse generation unit generating the magnetizing pulse by using positive power, and a main pulse generation unit generating a negative pulse by using negative power.

A modulator according to an exemplary embodiment of the present invention includes: a high voltage transformer transforming a voltage supplied through a primary side and a secondary side to apply a current pulse to a driving device; a pulse waveform controller consisting of a plurality of unit modules coupled in series with the secondary side of the high voltage transformer; and a timing controller adjusting an ON or OFF state of the solid-state switch of the unit module, wherein the unit module includes: a separate transformer adjusting the secondary side voltage of the high voltage transformer; a first diode connected to the negative power source of the waveform control power source and connected to the primary side of the separate transformer; a first solid-state switch connected to the positive power source of the waveform control power source, connected to the first diode, and controlling the ON or OFF state; a second solid-state switch connected to the negative power source of the waveform control power source and controlling the ON or OFF state; and a second diode connected to the positive power source of the waveform control power source and connected on the opposite side of the first diode of the primary side of the separate transformer.

A method for controlling a magnitude of a current pulse of a modulator according to an exemplary embodiment of the present invention includes: a step of applying a magnetizing pulse having an opposite polarity to a main pulse by a bipolar pulse generator through a connection line connected to a primary side of a high voltage transformer; a step of applying the magnetizing pulse to the primary side and inducing a voltage to the secondary side of the high voltage transformer disposed adjacent to the primary side; a step of applying the main pulse to the primary side through the connection line by a bipolar pulse generator by corresponding to a predetermined time difference; and a step of applying the main pulse to the primary side and inducing the voltage of the main pulse to the secondary side to control a magnitude of the voltage.

A method for controlling a waveform of a current pulse of a modulator according to an exemplary embodiment of the present invention includes: a step of receiving a condition corresponding to a waveform of a current pulse applied to a driving device; a step of scheduling ON/OFF state timing of a solid-state switch in the pulse waveform controller on a timing controller based on the input condition; a step of controlling an ON or OFF state of the solid-state switch according to the set scheduling; a step of decreasing/increasing the voltage through a pulse waveform power supplier connected to the solid-state switch according to the ON or OFF state of the solid-state switch to be applied to the secondary side of the high voltage transformer; and a step of adjusting the waveform of the current pulse of the high voltage according to the magnitude of the voltage applied to the secondary side of the high voltage transformer.

An exemplary embodiment of the present invention may freely change the magnitude or waveform of an electron beam or laser output in a radio frequency accelerator or a free electron laser using the magnetron as a radio frequency source.

An exemplary embodiment of the present invention allows for precise measurement by precisely controlling the radio frequency output waveform even in radar.

An exemplary embodiment of the present invention may improve the performance by controlling the pulse interval of a dual energy X-ray inspection system or randomly generate a larger number of multiple pulses. Therefore, the search performance may be improved remarkably through implementation of a new function such as a multi-energy X-ray inspection system.

An exemplary embodiment of the present invention is capable of selectively combining optimal electron beam energy and pulse to maximize an inspection capability in radio frequency accelerator based x-ray scanners activated for nondestructive testing.

DETAILED DESCRIPTION OF THE EMBODIMENTS

Figure 1:
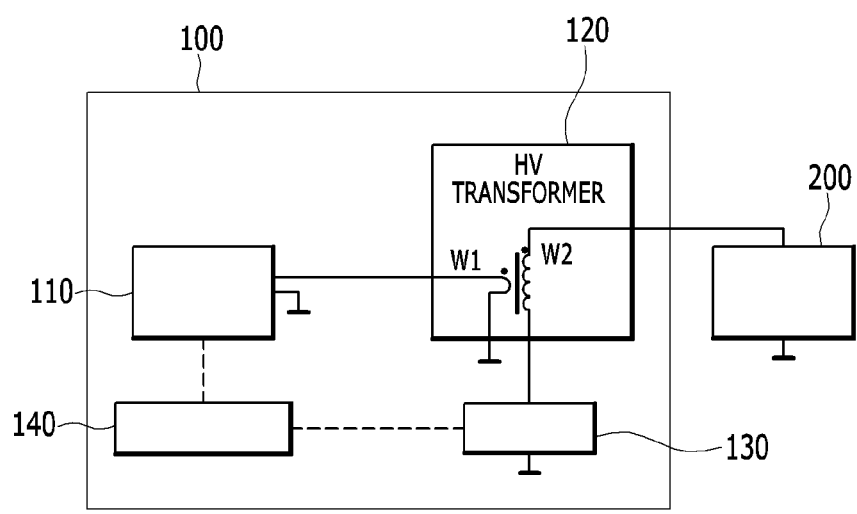
FIG. 1 is a schematic diagram showing a modulator for controlling a current pulse according to an exemplary embodiment of the present invention.

Hereinafter, exemplary embodiments of the present invention will be described in detail with reference to the attached drawings such that the present invention can be easily put into practice by those skilled in the art. As those skilled in the art would realize, the described embodiments may be modified in various different ways, all without departing from the spirit or scope of the present invention. The drawings and description are to be regarded as illustrative in nature and not restrictive. Like reference numerals designate like elements throughout the specification. In cases of publicly known technologies, a detailed description thereof will be omitted.

In addition, unless explicitly described to the contrary, the word "comprise" and variations such as "comprises" or "comprising" will be understood to imply the inclusion of stated elements but not the exclusion of any other elements.

Hereinafter, a modulator controlling a current pulse that is capable of arbitrary adjusting a magnitude of the current pulse or a waveform of the current pulse in real time is described with reference to FIG. 1.

FIG. 1 is a schematic diagram showing a modulator for controlling a current pulse according to an exemplary embodiment of the present invention.

As shown in FIG. 1, a modulator 100 for controlling a current pulse includes a bipolar pulse generator 110, a high voltage transformer 120, a pulse waveform controller 130, and a timing controller 140.

First, the bipolar pulse generator 110 applies a magnetizing pulse and a main pulse to a connection line connected to the primary side of a high voltage transformer.

The pulse generator 110 includes a magnetizing pulse unit for generating the magnetizing pulse by using a positive power and a main pulse generation unit for generating a negative pulse by using a negative power.

In this case, the bipolar pulse generator 110 generates the magnetizing pulse having an opposite polarity to the main pulse and a different magnitude to increase efficiency of the high voltage transformer 120. Also, the bipolar pulse generator 110 applies the magnetizing pulse generated before applying the main pulse to the primary side of the high voltage transformer 120.

Next, the high voltage transformer 120 applies the current pulse to a driving device 200 by transforming the voltage supplied through the primary side and the secondary side.

Here, the driving device 200 represents a magnetron but is not necessarily limited thereto.

Also, the pulse waveform controller 130 comprises at least one unit module coupled in series with the secondary side of the high voltage transformer 120.

The pulse waveform controller 130 may control the waveform of the current pulse by adding or subtracting the voltage from the unit module and applying the sum of the waveform due to the added/subtracted voltage to the secondary side of the high voltage transformer 120. At this time, the function of adding/subtracting the voltage of the unit module is controlled through the timing controller 140.

Next, the timing controller 140 adjusts the time difference for applying the magnetizing pulse and the main pulse of the bipolar pulse generator 110, and controls the on/off of a solid-state switch in the unit module of the pulse waveform controller 130.

The timing controller 140 may schedule the driving conditions of each bipolar pulse generator 110 and pulse waveform controller 130 according to the conditions of the magnitude of the current pulse or the waveform of the current pulse received from the user. At this time, the driving conditions include a timing and a time set for the ON state of the solid-state switch and a timing and a time set for the OFF state, and may be set in consideration of an organic relationship between a plurality of solid-state switches.

In other words, the timing controller 140 controls a plurality of solid-state switches included in each bipolar pulse generator 110 and a plurality of solid-state switches included in the pulse waveform controller 130, respectively.

Here, the solid-state switch represents an insulated gate bipolar transistor (IGBT). The solid-state switch is a power device that combines a metal oxide semiconductor field effect transistor (MOSFET) and a bipolar junction transistor (BJT). The solid-state switch has very high input impedance between the gate and the emitter, such that it is easier to drive than the bipolar junction transistor and it may flow a much larger current than metal oxide semiconductor field effect transistors.

Meanwhile, the modulator 100 may selectively include the bipolar pulse generator 110 and the pulse waveform controller 130 according to an exemplary embodiment.

For example, in the case of a modulator 100 that controls only the magnitude of the current pulse, it may include the bipolar pulse generator 110, the high voltage transformer 120, and the timing controller 140, and in the case of a modulator 100 that controls only the waveform of the current pulse, it may include the pulse high voltage transformer 120, the pulse waveform controller 130, and the timing controller 140. The configuration and function of the modulator 100 may be easily selected and designed by the user at a later time.

Next, the modulator for controlling the magnitude of the current pulse through the bipolar pulse generator is described with reference to FIG. 2 and FIG. 3.

Figure 2:
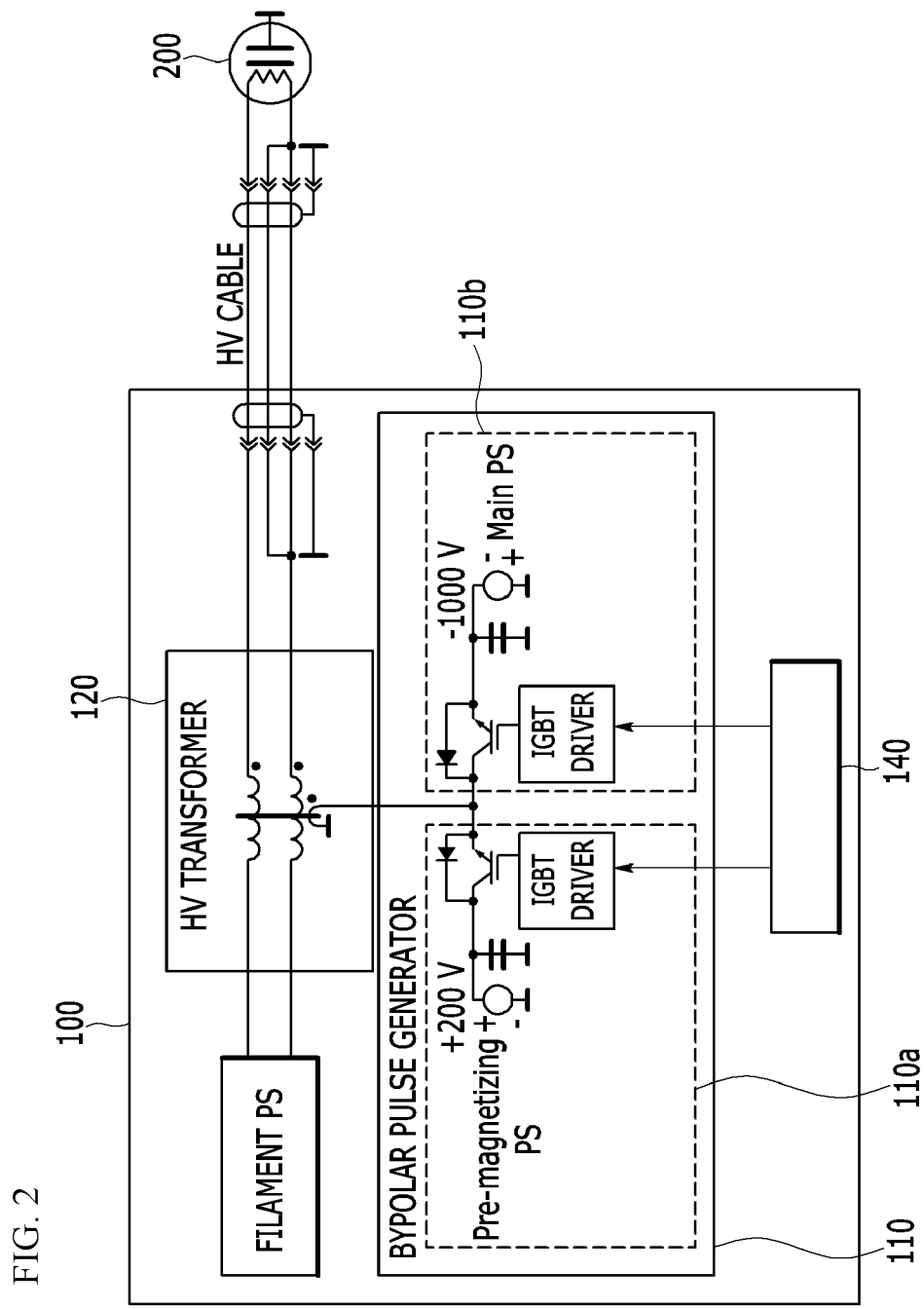
FIG. 2 is a schematic diagram showing a bipolar pulse generator controlling a magnitude of a current pulse according to an exemplary embodiment of the present invention.
Figure 3:
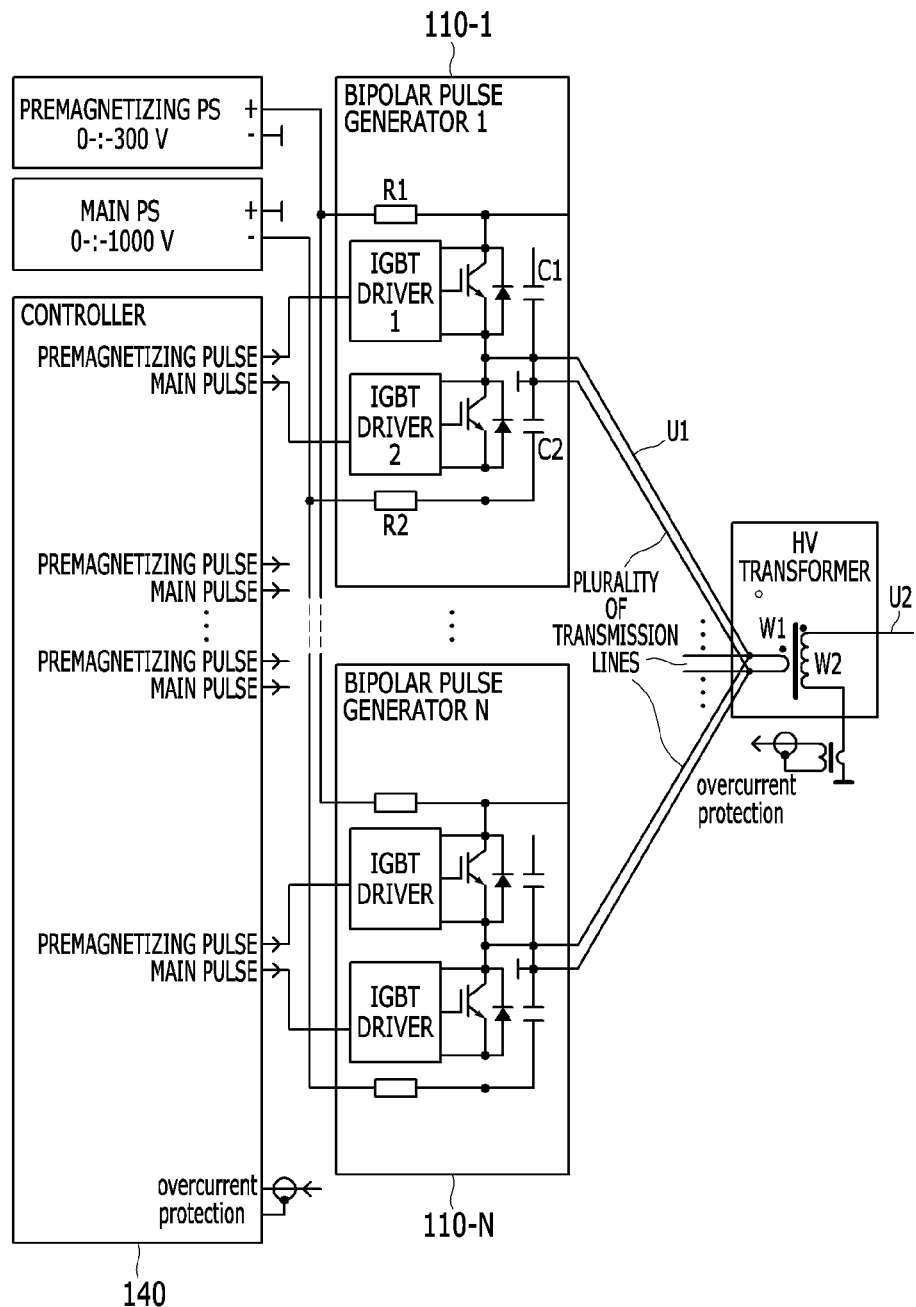
FIG. 3 is a schematic diagram showing a modulator coupling a plurality of bipolar pulse generators in parallel according to an exemplary embodiment of the present invention.

FIG. 2 is a schematic diagram showing a bipolar pulse generator controlling a magnitude of a current pulse according to an exemplary embodiment of the present invention, and FIG. 3 is a schematic diagram showing a modulator coupling a plurality of bipolar pulse generators in parallel according to an exemplary embodiment of the present invention.

As shown in FIG. 2, the bipolar pulse generator 110 is composed of a magnetizing pulse generation unit 110a at one side and a main pulse generation unit 110b at the other side on the connection line of the high voltage transformer 120.

First, the magnetizing pulse generation unit 110a includes a first power supply (a pre-magnetizing PS) supplying power of the magnetizing pulse and a first capacitor receiving the positive power from the first power supply (the pre-magnetizing PS) to be charged and discharging the charged positive power. The magnetizing pulse generation unit 110a includes a first diode connected to a connection position of the connection line and the first capacitor, and a first solid-state switch connected between the first capacitor and the first diode and controlling the ON or OFF state.

The first diode of the magnetizing pulse generation unit 110a controls the flow of the current in the first capacitor direction, and the first solid-state switch controls the flow of the current in the direction in which the main pulse generation unit 110b is disposed.

The process in which the magnetizing pulse generation unit 110a generates and applies the magnetizing pulse is as follows. The first capacitor is charged by receiving the positive power from the first power supply (the pre-magnetizing PS) supplying the positive magnetizing pulse power, and the first solid-state switch is set to the ON state based on the control signal of the timing control unit 140. If the first capacitor generates the magnetizing pulse having the positive characteristic while being discharged, the generated magnetizing pulse is applied to the primary side of the high voltage transformer 120.

On the other hand, the main pulse generation unit 110b includes a second power supply (a main PS) that supplies the power of the main pulse, and a second capacitor that receives the negative power from the second power supply (the main PS) to be charged and discharges the charged negative power. Also, the main pulse generation unit 110b includes a second solid-state switch connected to the second capacitor and connected to the first solid-state switch to control the ON or OFF state, and a second diode connected to the first diode and the second solid-state switch and connected at the connection point position with the connection line.

The second diode of the main pulse generation unit 110b controls the current flow to the connection point of the connection line, and the second solid-state switch controls the current flow in the direction in which the second capacitor is disposed.

The process in which the main pulse generation unit 110b generates and applies the main pulse is as follows. If the second capacitor is charged by receiving the negative power from the second power supply (the main PS) supplying the negative main pulse power, the second solid-state switch is set to the ON state corresponding to a predetermined time difference. As described above, the predetermined time difference is received from the timing controller 140, and may be input in advance from the user and scheduled and driven. Also, if the second capacitor generates the main pulse having the negative characteristic while being discharged, the generated main pulse is applied to the primary side of the high voltage transformer 120.

The processes generating and applying the magnetizing pulse and the main pulse may be sequentially generated, and if the application of the magnetizing pulse is finished, the first solid-state switch and the second solid-state switch both enter the OFF state. Also, the second solid-state switch is set as the ON state by the timing controller 140, and then the bipolar pulse generator 110 generates the main pulse and the generated main pulse is applied to the primary side of the high voltage transformer 120.

Like this, the timing controller 140 controls the timings at which the first solid-state switch and the second solid-state switch are turned on or off, thereby controlling the time at which the magnetizing pulse is applied to the primary side, the time at which the main pulse is applied to the primary side, and the time from when the application of the magnetizing pulse is finished to when the main pulse is applied.

On the other, as shown in FIG. 3, a plurality of bipolar pulse generators (110-1, . . . , 110-N, BIPOLAR PULSE GANERATOR SUBUNIT) may be connected to a high voltage transformer (HV TRANSFORMER). In this case, each bipolar pulse generator may be coupled in parallel to the plurality of connection lines (PLURALITY OF TRANSMISSION LINES) connected to the primary side of the high voltage transformer.

Here, the plurality of connection lines connected to the plurality of bipolar pulse generators 110-1 to 110-N and the primary side of the high voltage transformer 120 have the same impedance and length.

For example, while the main pulse (MAIN PS) is generated and provided, through the connection line of the same impedance and the same length, the value of the second capacitor C2 of each of the bipolar pulse generators 110-1 to 110-N is the same.

Also, a first power source (PREMAGNETIZING PS) and a second power source (MAIN PS) in the plurality of bipolar pulse generators 110-1 to 110-N may be independently disposed from the bipolar pulse generator 110 and connected to each magnetizing pulse generation unit and main pulse generation unit in the plurality of bipolar pulse generators 110-1 to 110-N.

When the plurality of bipolar pulse generators 110-1 to 110-N are configured, the timing controller 140 may control the ON or OFF timing of the the first solid-state switch (IGBT DRIVER 1) and the second solid-state switch (IGBT DRIVER 2) in each bipolar pulse generator.

In detail, the timing controller 140 controls the timings at which the first solid-state switch and the second solid-state switch in at least one bipolar pulse generator are turned on or off, thereby controlling the time at which the magnetizing pulse is applied to the primary side, the time at which the main pulse is applied to the primary side, and the time from when the application of the magnetizing pulse is finished to when the main pulse is applied.

Accordingly, as the time difference at which the magnetizing pulse and the main pulse are applied to the primary side is controlled by the timing controller 140, the magnitude of the voltage induced to the secondary side of the high voltage transformer 120 may be controlled.

Next, the change of the magnitude of the induced voltage of the high voltage transformer by applying the magnetizing pulse and the main pulse is described with reference to FIG. 4 FIG. 5A, FIG. 5B and FIG. 5C.

Figure 5A:
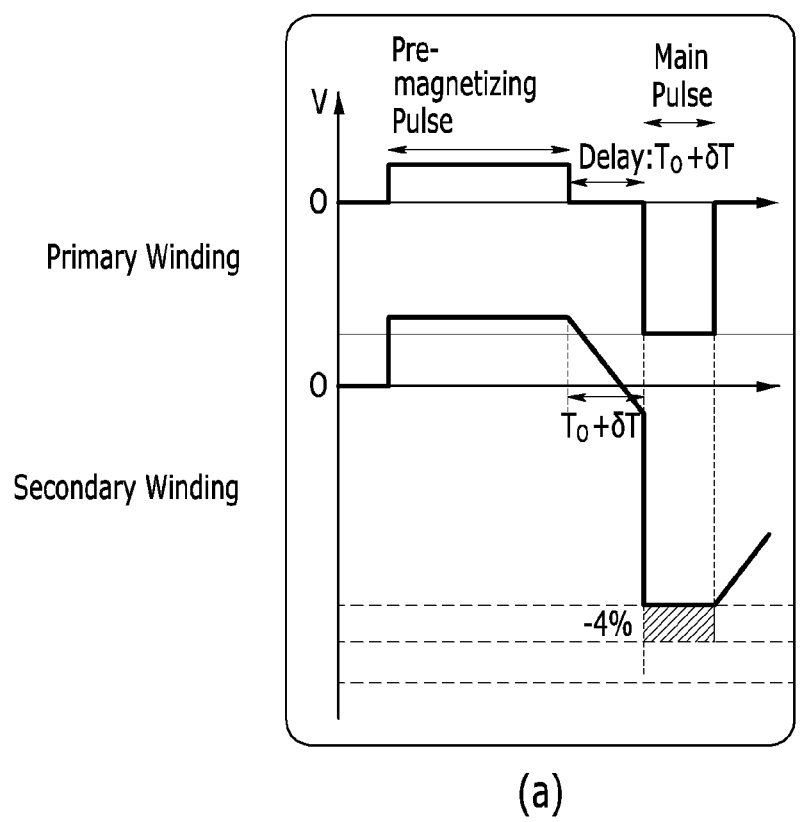
FIGS. 5A, 5B and 5C are an exemplary view showing a voltage magnitude that is changed depending on a driving time difference of a bipolar pulse generator according to an exemplary embodiment of the present invention.
Figure 5B:
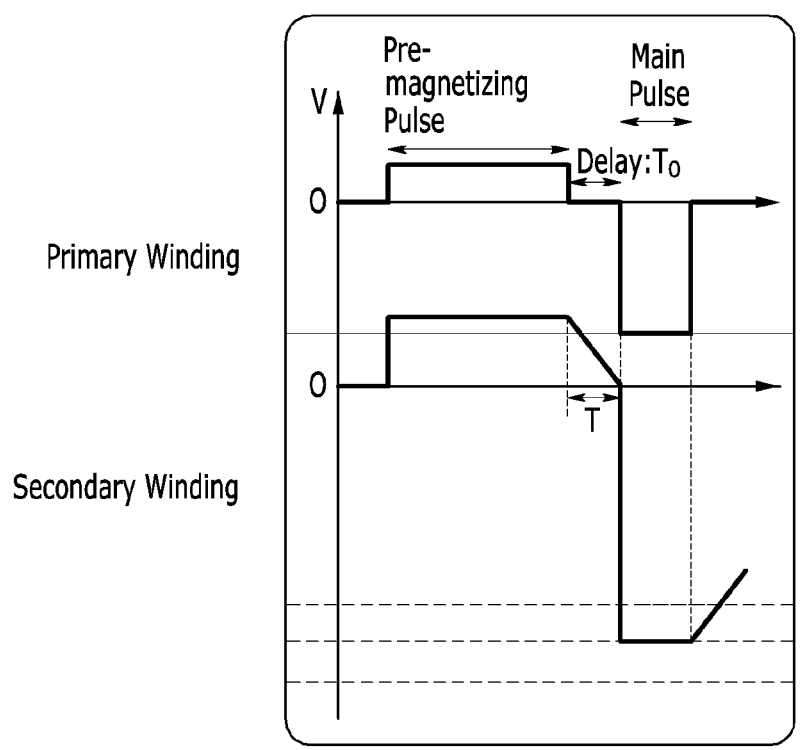
Figure 5C:
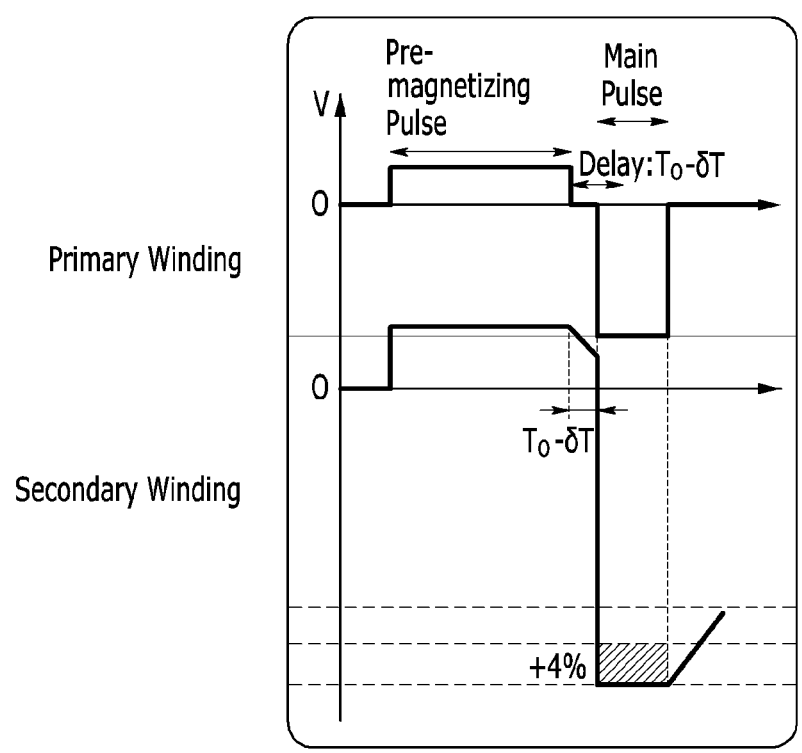
Figure 6:
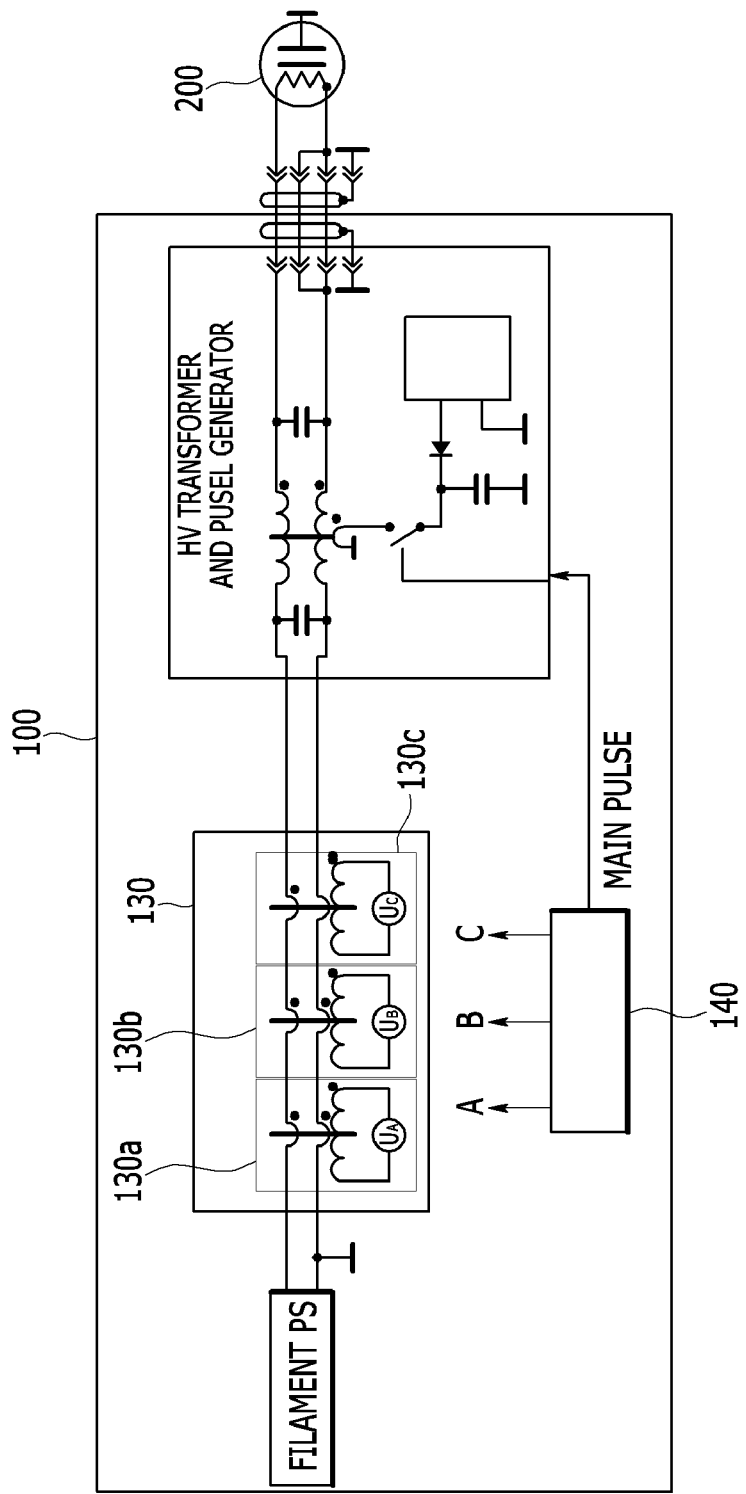
FIG. 6 is a schematic diagram showing a modulator for controlling a waveform of a current pulse according to an exemplary embodiment of the present invention.

FIGS. 5A, 5B and 5C are an exemplary view showing a voltage magnitude that is changed depending on a driving time difference of a bipolar pulse generator according to an exemplary embodiment of the present invention, and FIG. 6 is a schematic diagram showing a modulator for controlling a waveform of a current pulse according to an exemplary embodiment of the present invention.

Figure 4:
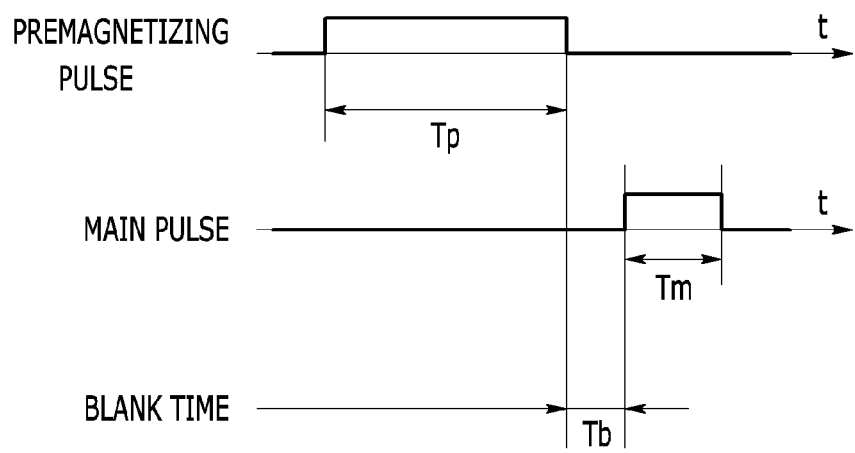
FIG. 4 is an exemplary view showing an application time difference of a bipolar pulse generator according to an exemplary embodiment of the present invention.

As shown in FIG. 4, the bipolar pulse generator 110 generates the magnetizing pulse (PREMAGNETIZING) during $T_P$ to be applied to the high voltage transformer 120, and generates the main pulse (MAIN PULSE) during $T_M$ to be applied to the high voltage transformer 120.

In this case, a blank time (BLANK TIME) is generated by the difference $T_B$ between when the application of the magnetizing pulse is finished and when the application of the main pulse starts.

The application time $T_P$ of the magnetizing pulse, the application time $T_M$ of the main pulse, and the time difference $T_B$ from when the application of the magnetizing pulse is finished to when the main pulse is applied may be controlled through the timing controller 140 and scheduled corresponding to the driving condition when receiving the driving condition from the user in advance.

Accordingly, by the timing controller 140, the magnetizing pulse and the main pulse are sequentially applied to the primary side of the high voltage transformer 120, and the magnitude of the voltage induced to the secondary side adjacent to the primary side is controlled.

FIGS. 5A, 5B, and 5C show the change of the magnitude of the voltage induced to the secondary side of the high voltage transformer 120 depending on the value of the difference ($T_B$, Delay).

FIGS. 5A, 5B, and 5C are graphs showing the change of the magnitude of the voltage measured from the high voltage transformer 120 under the difference of only the timing at which the main pulse is applied from the timing at which the application of the magnetizing pulse to the primary side (Primary Winding) of the high voltage transformer 120 is finished. Also, in FIGS. 5A, 5B, and 5C, the positive magnetizing pulse (Pre-magnetizing Pulse) and the negative main pulse (Main Pulse) are applied with a constant time and constant magnitude, respectively, other than the time when the main pulse is applied.

Referring to FIGS. 5A, 5B, and 5C, referring to the secondary side (Secondary Winding) of the high voltage transformer 120, it may be confirmed that the magnitude of the voltage varies from when the application of the magnetizing pulse is finished after the voltage of each constant magnitude is induced by the effect of the primary side (Primary Winding) to which the magnetizing pulse is applied.

In other words, on the secondary side of the high voltage transformer 120 from when the application of the magnetizing pulse is finished, the voltage is gradually reduced by the magnitude of a leakage inductance and a current capacitance.

Also, it may be confirmed that the magnitude of the voltage started on the induced timing on the secondary side is different depending on the difference of the timing at which the main pulse is applied to the primary side (Primary Winding).

It may be confirmed that the magnitude of the voltage finally changes according to the variation of the timing when the main pulse is applied through this difference.

Particularly, as shown in FIG. 5C, if the main pulse is applied directly after the application of the magnetizing pulse is finished, the voltage induced to the secondary side of the high voltage transformer 120 may obtain a maximum voltage, and as shown in FIG. 5A, if the difference of the application time of the magnetizing pulse and the main pulse is increased, the gradually lower magnitude of the voltage may be obtained by a certain time.

As above-described, by controlling the application timing of the magnetizing pulse and the main pulse, the magnitude of the voltage applied and induced to the high voltage transformer 120 is changed, thereby adjusting the magnitude of the current pulse finally supplied to the driving device.

Next, a configuration controlling the waveform of the current pulse through the modulator including the pulse waveform controller is described with reference to FIG. 6 to FIG. 9 in detail.

Figure 7:
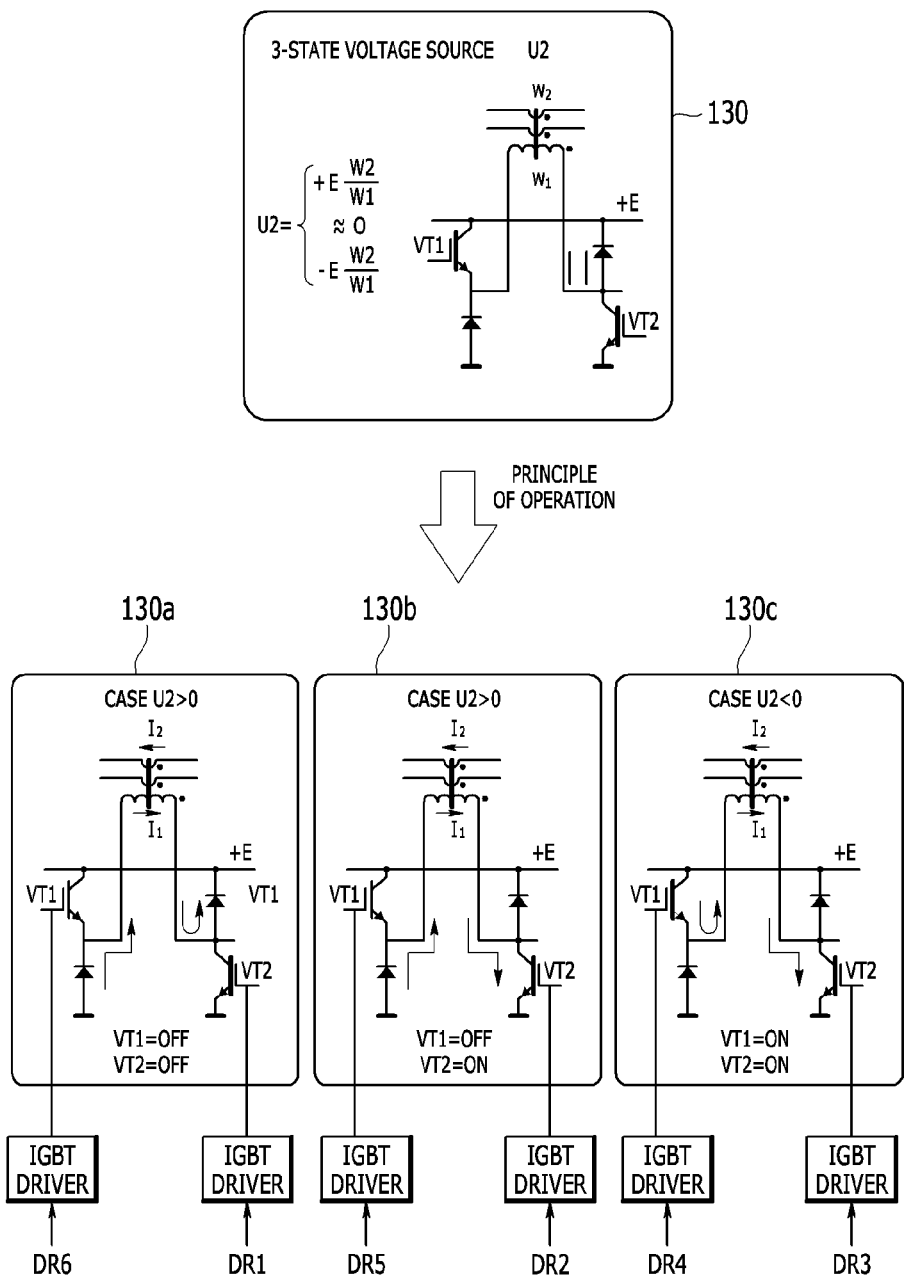
FIG. 7 is a schematic diagram showing a pulse waveform controller for controlling a waveform of a current pulse according to an exemplary embodiment of the present invention.

FIG. 6 is a schematic diagram showing a modulator for controlling a waveform of a current pulse according to an exemplary embodiment of the present invention, and FIG. 7 is a schematic diagram showing a pulse waveform controller for controlling a waveform of a current pulse according to an exemplary embodiment of the present invention.

As shown in FIG. 6, the modulator 100 may include a pulse waveform controller 130 disposed between a filament power supply (FIAMENT PS) and a high voltage transformer (HV TRANSFORMER).

The pulse waveform controller 130 consists of a plurality of unit modules each having a small separate transformer disposed in series with the secondary side of the high voltage transformer, thereby adding and subtracting the voltage magnitude of the current pulse transmitted to a load from the pulse generator (PULSE GENERATOR).

The pulse waveform controller 130 may include a plurality of unit modules 130a, 130b, and 130c, and FIG. 6 and FIG. 7 show three unit modules, however the current waveform controller 130 may include one or two unit modules or more than three unit modules.

Further, a pulse flattering circuit (PFC) may be implemented by the pulse waveform controller 130.

Next, the timing controller 140 may adjust the ON/OFF state of the solid-state switch in the pulse waveform controller 130 to control the magnitude of the voltage applied to the high voltage transformer 120.

First, a plurality of unit modules configuring the pulse waveform controller 130 may have a form as shown in FIG. 7.

Referring to FIG. 7, the unit module constituting the pulse waveform controller 130 is composed of a separate transformer, a solid-state switch, a diode, etc., and may include a common waveform control power source U2.

The unit module includes a first diode connected to the negative power source of the waveform control power source U2 and connected to the primary side of the separate transformer for controlling the secondary side voltage of the high voltage transformer and a first solid-state switch VT1 connected to the positive power source of the waveform control power source U2 and connected to the first diode to control the ON/OFF state. Also, the unit module includes a second solid-state switch VT2 connected to the negative power source of the waveform control power source U2 and controlling the ON/OFF state, and a second diode connected to the positive power source of the waveform control power source U2 and connected to the opposite side of the first diode of the primary side of the separate transformer. Here, the solid-state switch may include a diode of an opposite polarity coupled in parallel.

At this time, the first diode allows the current to flow in the direction where the secondary side of the high voltage transformer is disposed, and the first high-order device switch passes the current in the reverse direction where the secondary side of the high voltage transformer is disposed. The second diode allows the current to flow in the direction where the secondary side of the high voltage transformer is disposed and the second solid-state switch passes the current in the opposite direction where the secondary side of the high voltage transformer is disposed.

Such a unit module may be formed of a full-bridge or forward converter circuit structure and a separate transformer.

Each unit module may correct the current pulse in a form of the pulse having three values according to the ON/OFF state of the first solid-state switch VT1 and the second solid-state switch VT2.

130a of FIG. 7 represents the flow of the current in the state that the first solid-state switch VT1 and the second solid-state switch VT2 are both predetermined with the OFF state.

If the first solid-state switch VT1 and the second solid-state switch VT2 are both set to the OFF state, the current flows in the current direction of the first diode and the second diode, and the positive voltage (+E*W2/W1) may be added to the negative voltage of the secondary side of the high voltage transformer.

Resultantly, the magnitude of the voltage decreases.

Accordingly, the voltage of the secondary side of the applied high voltage is decreased.

In contrast, like 130b of FIG. 7, in the state that the first solid-state switch VT1 is set to OFF and the second solid-state switch VT2 is set to ON, the current flows in the direction of the first diode and the direction of the second switch without being added to the voltage and changed.

Likewise, even if the first solid-state switch VT1 is set to ON and the second solid-state switch VT2 is set to OFF, the voltage is not added and changed.

Also, like 130c of FIG. 7, if the first solid-state switch VT1 and the second solid-state switch VT2 are both set to the ON state, the current flows in the current direction of the first solid-state switch VT1 and the second solid-state switch VT2, and the negative voltage of the secondary side is further increased (−E*W2/W1).

As described above, one unit module may perform the correction of three types in which the voltage of the current applied to the high voltage transformer 120 is increased or decreased through the ON/OFF setting of the first solid switch and the second solid switch, or the voltage is not changed.

When the pulse waveform controller 130 is configured of the plurality of unit modules, since each unit module may perform the correction of three types, in the case of the n (n is a natural number) of the unit module, each unit module may be controlled with the arbitrary waveform made of the 2(n+1) steps.

On the other hand, the pulse waveform controller 130 may be configured as a second type.

Figure 8:
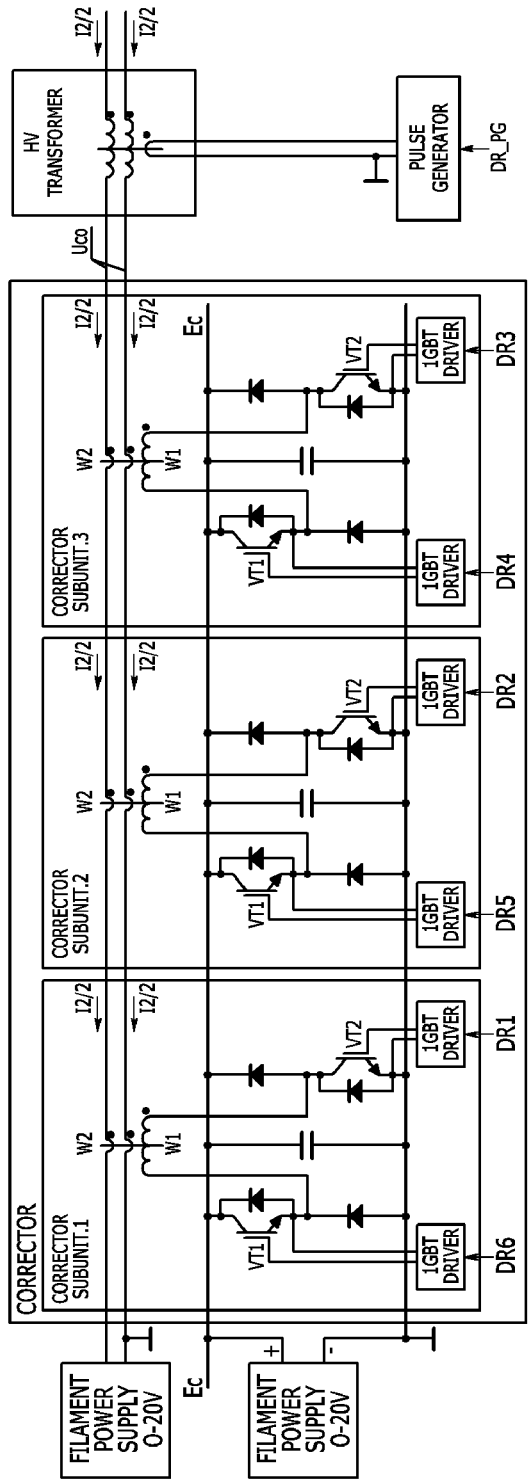
FIG. 8 is a schematic diagram showing a pulse waveform controller of a second type according to an exemplary embodiment of the present invention.

FIG. 8 is a schematic diagram showing a pulse waveform controller of a second type according to an exemplary embodiment of the present invention.

As shown in FIG. 8, the unit module (CORRECTOR SUBUNIT 1, CORRECTOR SUBUNIT 2, CORRECTOR SUBUNIT 3) included in the pulse waveform controller (CORRECTOR) may include four diodes, the first solid-state switch, and the second solid-state switch. In detail, as shown in FIG. 7, in the pulse waveform controller 130 including the first diode and the second diode, the third diode connected to the first solid-state switch and inducing the current flow opposite to the current flow direction of the first solid-state switch and the fourth diode connected to the second solid-state switch and inducing the current flow opposite to the current flow direction of the second solid-state switch, may be further included.

Here, the pulse generator 130 may have unipolar or bipolar characteristics.

The secondary windings of all unit modules may be coupled in series, and the voltage of the total output represents the sum of the voltages generated by the unit modules.

The waveform of the current pulse in which the voltage is increased or decreased according to the pulse waveform controller 130 is described with reference to FIG. 9.

Figure 9:
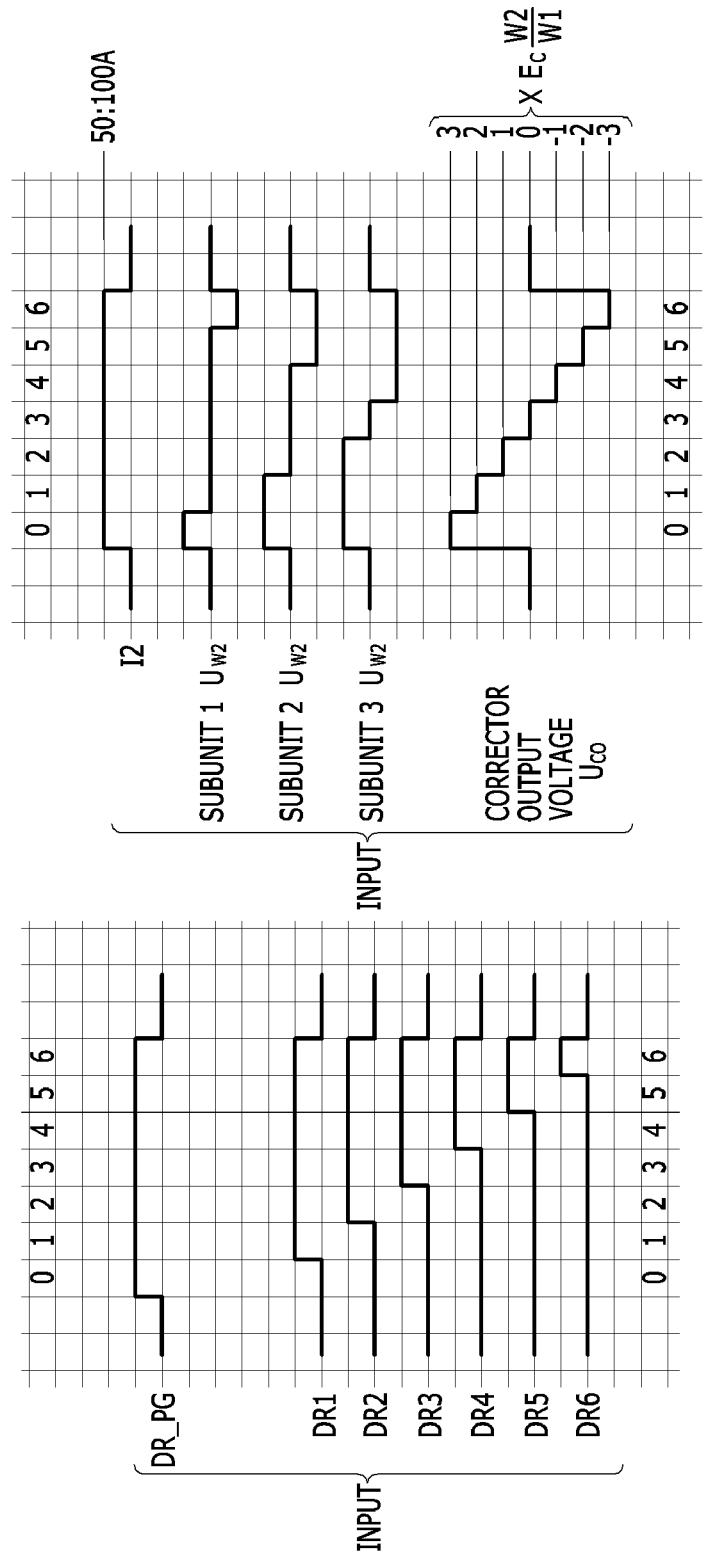
FIG. 9 is an exemplary view showing a configuration for controlling a waveform of a current pulse through a pulse waveform controller according to an exemplary embodiment of the present invention.

FIG. 9 is an exemplary view showing a configuration for controlling a waveform of a current pulse through a pulse waveform controller according to an exemplary embodiment of the present invention.

As shown in FIG. 9, the pulse waveform of DR_PG applied from the pulse generator is represented, and the ON/OFF state of each solid-state switch of the three unit modules is represented.

For example, referring to the first solid-state switch DR6 and the second solid-state switch DR1 of the first unit module, the first solid-state switch DR6 is set to the ON state from step 1 to step 6, and the second solid-state switch DR1 is set to the ON state only in step 6. Therefore, the controlled waveform of the first unit module in which the voltage is added in the predetermined section 0 in the state in which both the first solid-state switch DR6 and the second solid-state switch DR1 are in the OFF state and the voltage is applied in the predetermined section 6 in the state in which the first solid-state switch DR6 and the second solid-state switch DR1 are in the ON state is the same as the SUBUNIT 1 $U_{W2}$ of OUTPUT.

By the same method, the waveform of which the voltage is increased and decreased emerges like SUBUNIT 2 $U_{W2}$ of OUTPUT and SUBUNIT 3 $U_{W2}$ of OUTPUT through the ON or OFF state setting of the first solid-state switch DR5 and the second solid-state switch DR2 of the second unit module and the ON or OFF state setting of the first solid-state switch DR4 and the second solid-state switch DR3 of the third unit module.

As described above, the waveforms (SUBUNIT 1 UW2 of OUTPUT, SUBUNIT 2 UW2 of OUTPUT, and SUBUNIT 3 UW2 of OUTPUT) controlled through the pulse waveform controller 130 are waveform-summed for each step.

If the pulse waveform controller 130 includes three unit modules, the set of the output voltage values is 3, 2, 1, 0, −1, −2, −3.

At this time, in principle, new input data sets may be loaded for new shape generation per new pulse.

As such, the amplitude of the output voltage of the pulse waveform controller 130 may be changed slowly.

Therefore, the sum (CORRECTOR OUTPU VOLATE $U_{CO}$) of the waveforms of the decreased/increased voltage may be finally applied to the secondary side of the high voltage transformer 120 from each unit module to control the waveform of the current pulse.

Next, the modulator including the bipolar pulse generator and the pulse waveform controller is described in detail with reference to FIG. 10 and FIG. 11.

Figure 10:
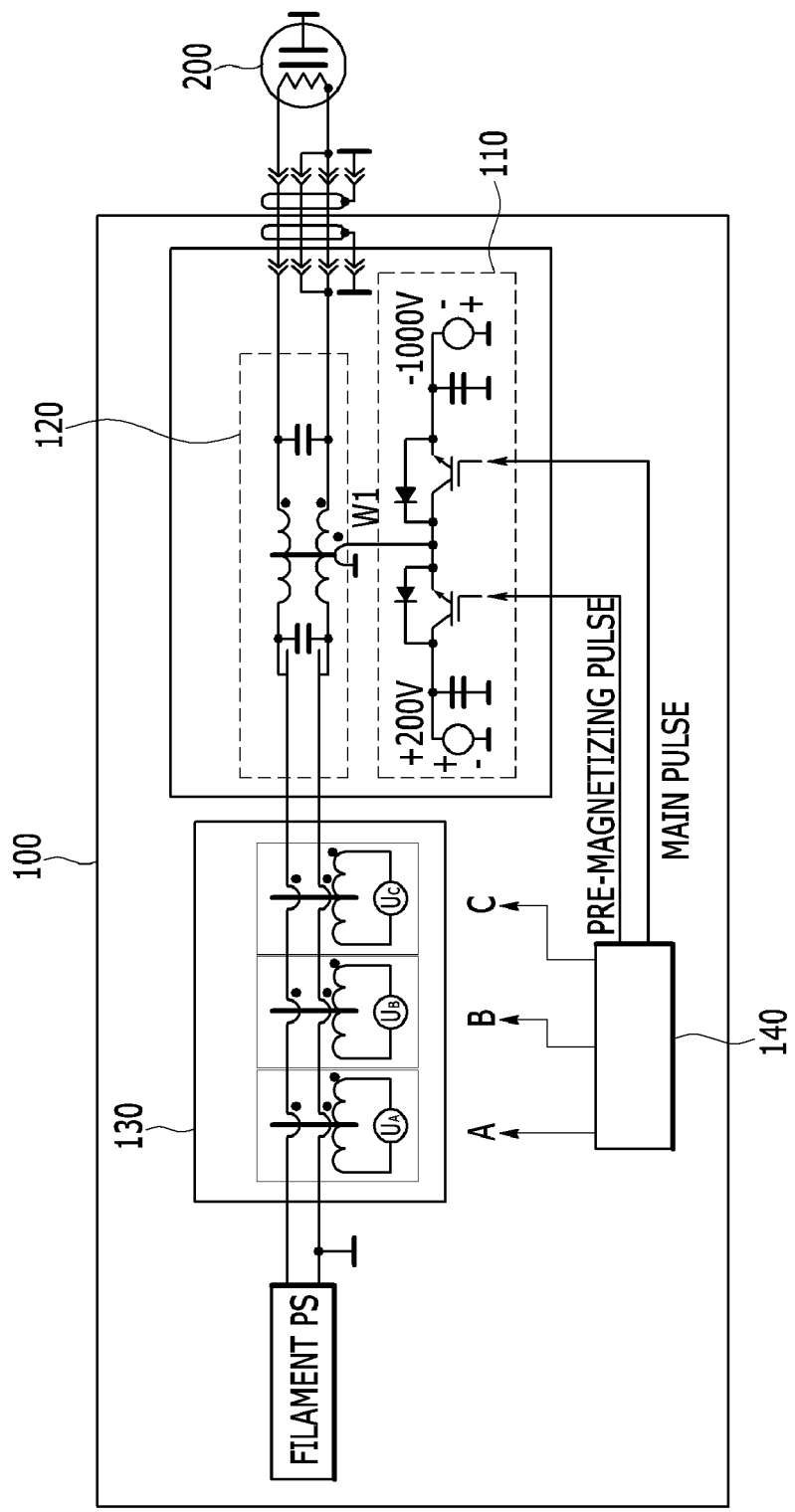
FIG. 10 is a schematic diagram showing a modulator for controlling a magnitude of a current pulse and a waveform of a current pulse according to an exemplary embodiment of the present invention.

FIG. 10 is a schematic diagram showing a modulator for controlling a magnitude of a current pulse and a waveform of a current pulse according to an exemplary embodiment of the present invention, and FIG. 11 is an exemplary view showing a current pulse controlled through a modulator according to an exemplary embodiment of the present invention.

As shown in FIG. 10, the modulator 100 includes both the bipolar pulse generator 110 controlling the magnitude of the current pulse and the pulse waveform controller 130 controlling the waveform of the current pulse.

Each description of the bipolar pulse generator 110 and the pulse waveform controller 130 is the same as that described in FIG. 2 and FIG. 8 such that it is omitted.

The modulator 100 may receive the condition corresponding to the magnitude and the waveform of the current pulse from the user to schedule the predetermined ON/OFF timing of each solid-state switch within the bipolar pulse generator 110 and the pulse waveform controller 130 by corresponding to the input condition.

Here, the modulator 100 may receive the configuration for controlling arbitrary multi-current pulses such as the condition in which the magnitude of the plurality of current pulses, the pulse width, and the time interval between the pulses are adjusted by the user. The modulator 100 may be scheduled so that the time difference that the magnetizing pulse and the main pulse are applied to the primary pulse is decreased as the magnitude of the input voltage increases based on the input condition.

The magnitude of the current pulse and the waveform of the current pulse may be controlled in real time by controlling each solid-state switch according to the scheduling through the timing controller 140.

In this case, the driving sequence of the bipolar pulse generator and the pulse waveform controller is not particularly limited.

Figure 11A:
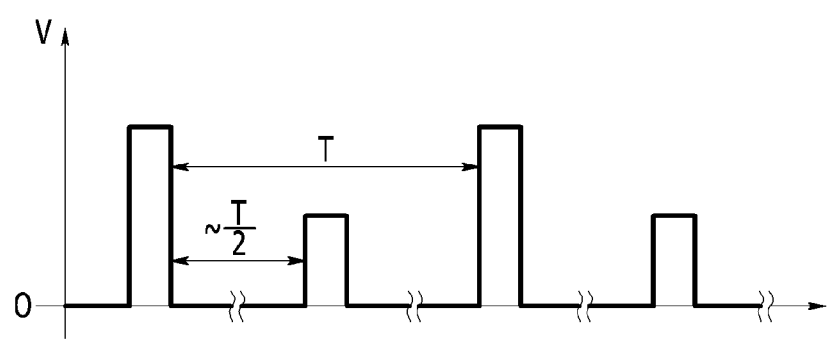
FIGS. 11A, 11B and 11C are an exemplary view showing a current pulse controlled through a modulator according to an exemplary embodiment of the present invention.
Figure 11B:
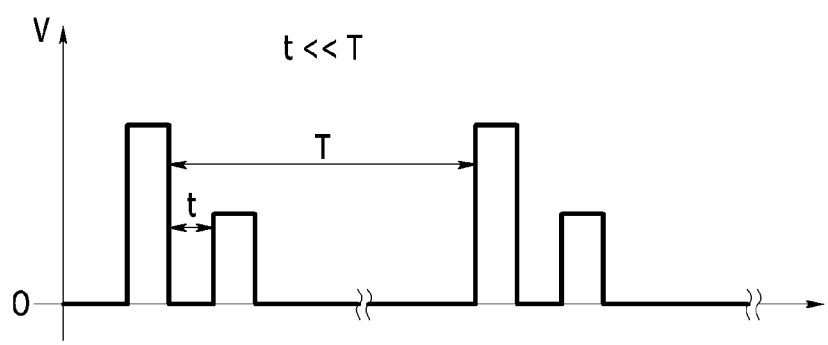

FIGS. 11A, 11B and 110 show an example in which the magnitude and the shape of the high voltage pulse current are adjusted based on the conditions input by the user to be supplied to the magnetron of the driving device.

FIG. 11A shows the case where the pulse outputs of two magnitudes are controlled with the interval of a predetermined time T and T/2 to be supplied, and FIG. 11B shows the case where a repetition period of the pulse output of the second magnitude is adjusted to be much faster than in FIG. 11A to be supplied in the process of outputting the pulses of two magnitudes.

Figure 11C:
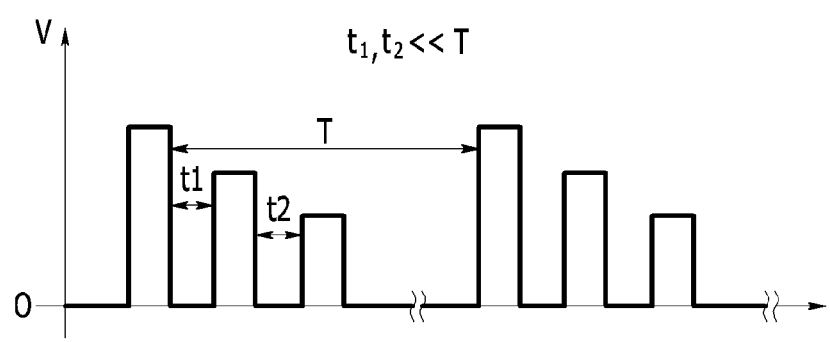

Also, FIG. 11C shows the case where the pulse (multi-pulses) outputs having three or more different outputs are controlled with the appropriate time interval to be supplied.

Since the interval between multiple pulses may be adjusted arbitrarily, various applications are possible through the modulator 100. For example, if the modulator 100 of the present invention is applied to a dual energy container searcher and the time interval between two pulses is controlled, since the search images made by two pulses having the close temporal interval are almost at the same position every time, there is no need to make a separate correction when image processing is performed by combining the two images. When generating and using X-rays of various energies of two or more by the multiple pulses, the kind of an object may be searched more precisely.

Thus, the modulator 100 may control the waveform of the current pulse to be supplied to the magnetron by controlling the magnitude of the current pulse through the time point at which the magnetizing pulse and the main pulse generated in the bipolar pulse generator 120 are applied to the primary side of the high voltage transformer 120, and adding or subtracting the magnitude of the voltage through the pulse waveform controller 130.

The function for controlling the magnitude of the current pulse and the function for controlling the waveform of the current pulse may be selectively operated as needed, and may be simultaneously realized in real time.

While this invention has been described in connection with what is presently considered to be practical exemplary embodiments, it is to be understood that the invention is not limited to the disclosed embodiments.

On the contrary, it is intended to cover various modifications and equivalent arrangements included within the spirit and scope of the appended claims.

DESCRIPTION OF SYMBOLS

100: modulator
110: bipolar pulse generator
110a: magnetizing pulse generation unit
110b: main pulse generation unit
120: high voltage transformer
130: pulse waveform controller
140: timing controller
200: driving device

What is claimed is:

1. A modulator comprising:
a high voltage transformer transforming a voltage supplied through a primary side and a secondary side to apply a current pulse to a driving device;
a bipolar pulse generator applying a magnetizing pulse and a main pulse to a connection line connected to the primary side of the high voltage transformer; and
a timing controller controlling a time difference of applying the magnetizing pulse and the main pulse,
wherein the bipolar pulse generator includes
a magnetizing pulse generation unit generating the magnetizing pulse by using positive power, and
a main pulse generation unit generating a negative pulse by using negative power,
wherein a magnitude of a voltage induced to the secondary side is adjusted by controlling a time difference at which the magnetizing pulse and the main pulse are applied to the primary side.

2. The modulator of claim 1, wherein
the magnetizing pulse generation unit includes:
a first power supply supplying power of the magnetizing pulse;
a first capacitor charged by receiving the positive power from the first power supply and discharging the charged positive power;
a first diode connected to a connection position of the connection line and the first capacitor; and
a first solid-state switch connected between the first capacitor and the first diode and controlling an ON/OFF state.

3. The modulator of claim 2, wherein
the main pulse generation unit includes:

a second power supply supplying power of the main pulse;
a second capacitor receiving the negative power from the second power supply to be charged and discharging the charged negative power;
a second solid-state connected to the second capacitor and connected to the first solid-state switch to control the ON/OFF state; and
a second diode connected to the first diode and the second solid-state switch, and connected to a connection point position with the connection line.

4. The modulator of claim 3, wherein
the timing controller controls a time at which the magnetizing pulse is applied to the primary side, a time at which the main pulse is applied to the primary side, and a time from when the application of the magnetizing pulse is finished to when the main pulse is applied by controlling when the first solid-state switch and the second solid-state switch are turned on/off.

5. The modulator of claim 4, wherein
the bipolar pulse generator applies the main pulse to the primary side at second timing after a predetermined time passes corresponding to control of the timing controller if the magnetizing pulse is applied to the primary side at first timing.

6. The modulator of claim 1, further comprising
a plurality of bipolar pulse generators, and
the plurality of bipolar pulse generators are coupled in parallel to the primary side of the high voltage transformer through a plurality of connection lines having the same impedance and length.

7. The modulator of claim 6, further comprising
a pulse waveform controller consisting of a plurality of unit modules including a separate transformer adjusting a secondary side voltage of the high voltage transformer, a third solid-state switch having one terminal connected to a positive power source of a waveform control power source, and a fourth solid-state switch connected to the primary side of the separate transformer and having one terminal connected to a negative power source of the waveform control power source, and
the timing controller controls the ON or OFF setting timing of the third solid-state switch and the fourth solid-state switch of the pulse waveform controller.

8. The modulator of claim 7, wherein,
if the third solid switch and the fourth solid switch are set to the ON state, the voltage of the applied current is further increased, and
if the third solid switch and the fourth solid switch are set to the OFF state, the voltage of the applied current is further decreased.

9. The modulator of claim 1, wherein
the current pulse of the magnitude adjusted according to a difference of application timing of the magnetizing pulse and the main pulse is supplied to the magnetron through the bipolar pulse generator.

10. A modulator comprising:
a high voltage transformer transforming a voltage supplied through a primary side and a secondary side to apply a current pulse to a driving device;
a pulse waveform controller consisting of a plurality of unit modules coupled in series with the secondary side of the high voltage transformer; and
a timing controller adjusting the ON or OFF state of the solid-state switch of the unit module,
wherein the unit module includes:
a separate transformer adjusting the secondary side voltage of the high voltage transformer; a first diode connected to a negative power source of a waveform control power source and connected to the primary side of the separate transformer;
a first solid-state switch connected to a positive power source of the waveform control power source, connected to the first diode, and controlling the ON or OFF state;
a second solid-state switch connected to the negative power source of the waveform control power source and controlling the ON or OFF state; and
a second diode connected to the positive power source of the waveform control power source and connected on the opposite side of the first diode of the primary side of the separate transformer,
wherein when a waveform of which a voltage magnitude is adjusted is applied from the plurality of unit modules coupled in series to the secondary side, a waveform of the current pulse is controlled through a sum of the waveforms applied from the unit modules.

11. The modulator of claim 10, wherein
the unit module is formed of a full-bridge or forward convert circuit structure and a separate transformer.

12. The modulator of claim 10, wherein,
for the unit module,
if the first solid switch and the second solid switch are set to the OFF state, the secondary side voltage of the applied high voltage is decreased, and
if the first solid switch and the second solid switch are set as the ON state, the secondary side voltage of the applied high voltage is increased, and
if only one of the first solid switch and the second solid switch is set to the ON state, there is no voltage change of the applied current.

13. The modulator of claim 10, wherein
if the pulse waveform controller includes n (n is a natural number) unit modules, an arbitrarily waveform of 2(n+1) steps is controlled.

14. The modulator of claim 10, further comprising
a bipolar pulse generator applying the magnetizing pulse and the main pulse to a connection line connected to the primary side of the high voltage transformer, and
the timing controller controls driving timing of the solid-state switch in the bipolar pulse generator.

15. The modulator of claim 14, wherein
the bipolar pulse generator includes:
a magnetizing pulse generation unit including a first power supply supplying power of the magnetizing pulse;
a first capacitor receiving the positive voltage from the first power supply to be charged and discharging the charged positive voltage;
a first diode connected to a connection position of the first connection line and the first capacitor; and
a first solid-state switch connected between the first capacitor and the first diode and controlling the ON or OFF state; and
a main pulse generation unit including a second power supply supplying power of the main pulse;
a second capacitor receiving the negative voltage from the second power supply to be charged and discharging the charged negative voltage;
a second solid-state switch connected to a position between the second capacitor and the second diode and the first solid-state switch and controlling the ON or OFF state; and a second diode connected to the first diode and the second solid-state switch and connected to a connection point position with the connection line.

16. A method for controlling a magnitude of a current pulse of a modulator, comprising:
a step of applying a magnetizing pulse having an opposite polarity to a main pulse by a bipolar pulse generator through a connection line connected to a primary side of a high voltage transformer;
a step of applying the magnetizing pulse to the primary side and inducing a voltage to a secondary side of the high voltage transformer disposed adjacent to the primary side;
a step of applying the main pulse to the primary side through the connection line by a bipolar pulse generator by corresponding to a predetermined time difference; and
a step of applying the main pulse to the primary side and inducing the voltage of the main pulse to the secondary side to control a magnitude of the voltage,
wherein when the main pulse is applied to the primary side directly after applying the magnetizing pulse, a magnitude of the voltage induced to the secondary side is a maximum, and
wherein as the predetermined time difference is increased, the magnitude of the voltage induced to the secondary side is decreased.

17. The method for controlling the magnitude of the current pulse of claim 16, wherein
the step of applying the magnetizing pulse includes:
a step of receiving positive power from a first power supply supplying positive magnetizing pulse power to charge a first capacitor;
a step of setting a first solid-state switch connected to the connection line connected to the primary side and the first capacitor as an ON state;
a step of generating the magnetizing pulse while the first capacitor is discharged; and
a step of flowing the magnetizing pulse only in one direction at a connection point position with the connection line connected to the primary side to be applied to the primary side.

18. The method for controlling the magnitude of the current pulse of claim 17, wherein
the step of applying the main pulse to the primary side includes:
a step of receiving negative power from a second power supply supplying negative main pulse power to charge a second capacitor;
a step of setting a second solid-state switch connected to the connection line connected to the primary side and the second capacitor to an ON state by corresponding to a predetermined time difference;
a step of generating the main pulse while the second capacitor is discharged; and
a step of flowing the main pulse only in a connection point direction with the connection line connected to the primary side to be applied to the primary side.

19. The method for controlling the magnitude of the current pulse of claim 16, further comprising
a step of decreasing and increasing the voltage connected and applied to the secondary side of the high voltage transformer to control a waveform of the current pulse.

20. The method for controlling the magnitude of the current pulse of claim 19, wherein,
in the step of controlling the waveform of the current pulse, the adjusted voltage magnitude is applied from each unit module and the waveform of the current pulse is finally controlled through a sum of the waveform of the applied voltage pulse based on n (n is a natural number) unit modules of a pulse waveform controller in which the secondary side of the high voltage transformer and a separate transformer are coupled in series.

21. A method for controlling a waveform of a current pulse of a modulator, comprising:
a step of receiving a condition corresponding to a waveform of a current pulse applied to a driving device;
a step of scheduling an ON/OFF setting timing of a solid-state switch in a pulse waveform controller on a timing controller based on the input condition;
a step of controlling an ON or OFF state of the solid-state switch according to the set scheduling;
a step of decreasing/increasing the voltage through a pulse waveform power supplier connected to the solid-state switch according to the ON or OFF state of the solid-state switch to be applied to the secondary side of the high voltage transformer; and
a step of adjusting the waveform of the current pulse of the high voltage according to the magnitude of the voltage applied to the secondary side of the high voltage transformer,
wherein the pulse waveform controller includes a plurality of unit modules coupled in series,
wherein each of the plurality of unit modules includes:
a first solid-state switch connected to a positive power source of a waveform control power source and controlling the ON or OFF state;
a second solid-state switch connected to a negative power source of the waveform control power source and controlling the ON or OFF state; and
a separate transformer adjusting the voltage of the secondary side of the high voltage transformer.

22. The method for controlling the waveform of the current pulse of claim 21, wherein,
in the step of scheduling the ON/OFF setting timing of the solid-state switch,
if the first solid switch and the second solid switch are set to the OFF state, the magnitude of the applied current is decreased,
if the first solid switch and the second solid switch are set to the ON state, the magnitude of the applied current is increased, and
if only one of the first solid switch and the second solid switch is set to the ON state, the magnitude of the applied current is not changed.

23. The method for controlling the waveform of the current pulse of claim 22, wherein,
in the step of adjusting the waveform of the current pulse,
if the waveform of which the voltage magnitude is adjusted is received from the plurality of unit modules coupled in series to the secondary side, the waveform of the voltage pulse is controlled through a sum of the applied waveforms from each unit module, and
the voltage waveform of 2(n+1) steps is controlled through n (n is a natural number) unit modules.

24. The method for controlling the waveform of the current pulse of claim 21, further comprising:
a step of applying a magnetizing pulse from the bipolar pulse generator connected to the primary side of the high voltage transformer to the primary side of the high voltage transformer;

a step of applying a main pulse to the primary side of the high voltage transformer if a predetermined time passes; and a step of applying the magnetizing pulse voltage and the main pulse voltage to the secondary side of the high voltage transformer adjacent to the primary side of the high voltage transformer.

25. The method for controlling the waveform of the current pulse of claim 24, wherein, in the step of receiving the condition, a condition for the magnitude of the current pulse applied to the magnetron is input, in the scheduling step, the time difference between when the magnetizing pulse and the main pulse are applied to the primary side is scheduled to be decreased as the magnitude of the input voltage is increased based on the condition for the magnitude of the current pulse.

26. The method for controlling the waveform of the current pulse of claim 24, wherein, if a condition that the magnitude of the plurality of current pulses applied to the magnetron, a pulse width, and a time interval between the pulses are adjusted are input, in the scheduling step, based on the condition for the magnitude of the plurality of current pulses, it is scheduled that the time difference between when the magnetizing pulse and the main pulse are applied to the primary side as the magnitude of the input voltage is increased, and the waveform of each pulse is adjusted by the pulse waveform controller.

\* \* \* \* \*